(12) United States Patent
Grey et al.

(10) Patent No.: US 8,456,808 B2
(45) Date of Patent: Jun. 4, 2013

(54) DISPLAY WALL MOUNT WITH ELASTOMERIC SPRING LATCH AND POST-INSTALLATION HEIGHT ADJUSTMENT AND LEVELING FEATURE

(75) Inventors: Dominic Grey, Blaine, MN (US); Joel Pfister, Golden Valley, MN (US); Peter Tribuno, Roseville, MN (US)

(73) Assignee: Milestone AV Technologies LLC, Eden Prairie, MN (US)

( * ) Notice: Subject to any disclaimer, the term of this patent is extended or adjusted under 35 U.S.C. 154(b) by 225 days.

(21) Appl. No.: 12/675,384

(22) PCT Filed: Sep. 8, 2008

(86) PCT No.: PCT/US2008/075546
§ 371 (c)(1),
(2), (4) Date: Aug. 3, 2010

(87) PCT Pub. No.: WO2009/033133
PCT Pub. Date: Mar. 12, 2009

(65) Prior Publication Data
US 2010/0309615 A1 Dec. 9, 2010

Related U.S. Application Data

(60) Provisional application No. 60/970,429, filed on Sep. 6, 2007, provisional application No. 61/019,126, filed on Jan. 4, 2008.

(51) Int. Cl.
H05K 7/14 (2006.01)
(52) U.S. Cl.
USPC ............... 361/679.01; 361/679.22; 248/201

(58) Field of Classification Search
USPC ............ 361/679.01, 679.02, 679.22, 679.27; 248/917–924
See application file for complete search history.

(56) References Cited

U.S. PATENT DOCUMENTS

| | | | |
|---|---|---|---|
| 2,791,388 A | 5/1957 | Hirt | |
| 2,877,687 A | 3/1959 | Bozin | |
| 2,943,821 A | 7/1960 | Goss | |
| 2,975,994 A | 3/1961 | Goss | |
| 6,068,227 A | 5/2000 | Morgan et al. | |
| 6,402,109 B1 * | 6/2002 | Dittmer | 248/284.1 |

(Continued)

FOREIGN PATENT DOCUMENTS

| | | |
|---|---|---|
| DE | 2022005019637 U1 | 5/2006 |
| EP | 1559947 A2 | 8/2005 |
| JP | 2000206901 A | 7/2000 |

OTHER PUBLICATIONS

Communication Pursuant to Article 94(3) EPC re EP Application No. 08799285.5-1241, dated Aug. 29, 2011.

(Continued)

Primary Examiner — Jinhee Lee
Assistant Examiner — Ingrid Wright
(74) Attorney, Agent, or Firm — Patterson Thuente Pedersen, PA

(57) ABSTRACT

A mounting system for an electronic display providing enhanced versatility of movement and ease of installation. The mounting system includes a latch and kickstand assembly for latching the display to a support structure mountable to a wall and propping the bottom edge of the display away from the wall to enable connection of wires to the back of the display while the display is mounted on the wall. The mount further includes a vertical position adjustment assembly to enable vertical positioning and leveling of the display after the display is mounted.

31 Claims, 22 Drawing Sheets

U.S. PATENT DOCUMENTS

| | | |
|---|---|---|
| 6,418,010 B1 | 7/2002 | Sawyer |
| 6,554,242 B2 | 4/2003 | Kim |
| 6,559,829 B1 | 5/2003 | Matsuo et al. |
| 6,578,812 B2 | 6/2003 | Lemire |
| 6,585,203 B1 | 7/2003 | Euker |
| 6,604,722 B1 | 8/2003 | Tan |
| 6,659,418 B2 | 12/2003 | Lemire |
| 6,901,987 B1 | 6/2005 | Graham |
| 6,923,413 B2 | 8/2005 | Dozier |
| 7,070,156 B2 | 7/2006 | Liao |
| 7,175,146 B2 | 2/2007 | Kim |
| 7,178,775 B2 | 2/2007 | Pfister et al. |
| 7,316,379 B1 | 1/2008 | Graham |
| 2003/0201372 A1 | 10/2003 | Dozier |
| 2004/0211870 A1 | 10/2004 | Bremmon et al. |
| 2004/0245420 A1 | 12/2004 | Pfister et al. |
| 2005/0274858 A1* | 12/2005 | Fedewa ............... 248/284.1 |
| 2006/0065800 A1* | 3/2006 | Bremmon ............ 248/274.1 |
| 2006/0208139 A1 | 9/2006 | Mossman |
| 2007/0023599 A1* | 2/2007 | Fedewa ............... 248/284.1 |
| 2007/0235614 A1 | 10/2007 | O'Keene et al. |

OTHER PUBLICATIONS

Chinese Office Action re Chinese Application No. 200880115314.9, Dated Aug. 9, 2011. 9 Pages.

Supplemental European Search Report for European Patent App. No. 08799285.5, Dated Aug. 5, 2010.

File Wrapper History of U.S. Appl. No. 11/200,327, Filed Aug. 9, 2005.

File Wrapper History of U.S. Appl. No. 12/684,711, Filed Jan. 8, 2010.

* cited by examiner

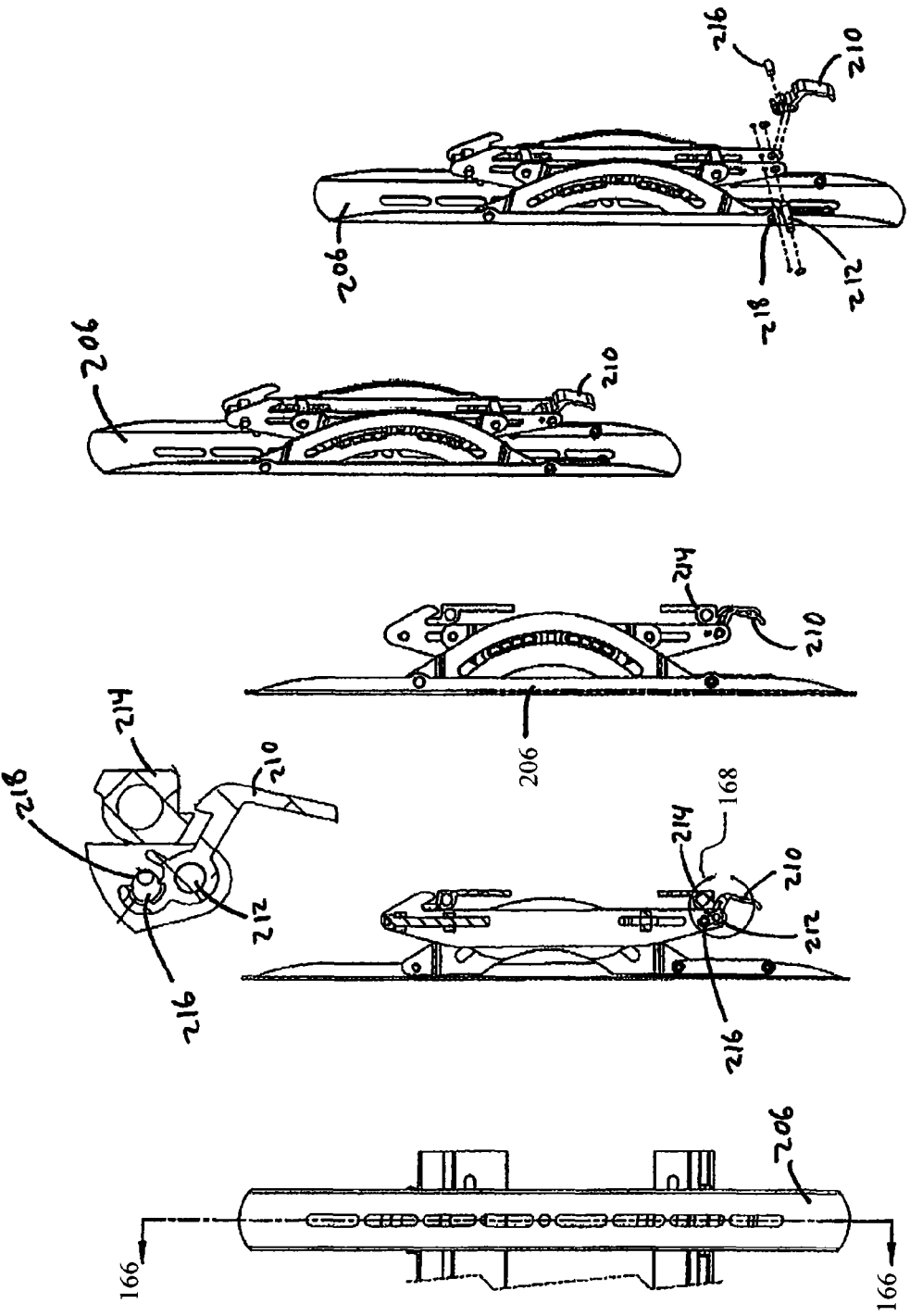

DISPLAY WALL MOUNT WITH ELASTOMERIC SPRING LATCH AND POST-INSTALLATION HEIGHT ADJUSTMENT AND LEVELING FEATURE

RELATED APPLICATIONS

This application claims the benefit of U.S. Provisional Patent Application No. 60/970,429, filed Sep. 6, 2007, hereby fully incorporated herein by reference.

FIELD OF THE INVENTION

The present invention relates generally to mounts for video display devices, and more particularly to mounts for flat panel displays.

BACKGROUND OF THE INVENTION

Flat panel monitors and televisions have become highly popular and widely used throughout commercial, business, and residential environments. These flat panel displays enable an enhanced viewing experience with layout versatility, space savings, and the ability to replace bulky computer monitors and televisions with displays that are merely a fraction of the depth and weight of similar prior displays of identical screen size.

The dimensional characteristics of the displays allow them to be conveniently hung on a wall or connected to a mounting surface such as a column, post, or flat surface of a piece of furniture. It is preferable for aesthetic reasons that the display be mounted as closely as possible to the surface in order to achieve the appearance of a framed item such as a photograph or painting. Further, it is often desirable to be capable of readily adjusting the orientation and position of the flat panel display relative to the surface. Versatility of movement of the mount is key to achieving a device that is positioned exactly in the most functional or aesthetically pleasing location desired by the user. Such versatility is particularly desirable as the unique characteristics of a wall or mounting surface may dictate the location where the mount may be attached.

Many prior mounts have been somewhat difficult to install and adjust as access to the area behind a flat panel display is often very limited during and after the installation process. Moreover, because many larger displays are heavy and hard to lift and position, it is very difficult to make mounting modifications during installation without completely removing the display from the wall.

Therefore, there is a need for a display mount with enhanced versatility of positioning and adjustment. Likewise, an improved display mount that is easy to install, use, retain in a stable configuration, and which provides necessary access to the rear of the display is desired.

SUMMARY OF THE INVENTION

The present invention addresses the need of the industry for a flat panel display mount that provides enhanced versatility of movement and ease of installation, maintenance, and manipulation. According to embodiments of the invention, a mount for attaching an electronic display to a wall includes a support structure adapted to attach to the wall and presenting a pair of vertically spaced-apart generally horizontally oriented flanges. The mount further includes a pair of display interface brackets, each of the display interface brackets including a display interface portion adapted to attach to the electronic display, and a hook bracket assembly operably coupled to the display interface bracket. The hook bracket assembly presents a hook selectively engagable over an upper one of the flanges of the support structure to hang the display interface brackets and the display from the support structure and further includes a vertical position adjustment assembly operably coupled to the display interface bracket. The vertical position adjustment assembly enables selective vertical positioning of the display interface portion and the display relative to the support structure.

In embodiments of the invention, the vertical position adjustment assembly includes an adjustment screw and a traveling block with the traveling block operably coupled to the display interface bracket. The hook bracket assembly may further include a latch assembly for latching the display interface bracket to a lower one of the flanges of the support structure. The latch assembly may include a vertically slidable housing selectively shiftable between a first latched position in which a tab portion of the housing is engaged behind the lower one of the flanges of the support structure, and a second unlatched position in which the tab portion is clear of the lower one of the flanges to enable the display interface bracket to be disengaged from the support structure. The latch assembly may include a spring biasing the housing toward the latched position, and a kickstand selectively shiftable between a first position in which an end of the kickstand is engaged with the support structure to prop a bottom edge of the display away from the wall, and a second position in which the kickstand is clear of the support structure to enable the latch assembly to be engaged with the support structure.

In embodiments, the latch assembly may include a handle structure pivotally coupled to the hook bracket assembly, the handle structure defining a groove for engaging the lower one of the flanges of the support structure. The handle structure is selectively shiftable between a first latched position in which the groove is engaged with the lower one of the flanges of the support structure to latch the display interface bracket to the support structure, and a second unlatched position in which the groove is clear of the lower one of the flanges of the support structure to enable the display interface bracket to be disengaged from the support structure. The mount may further include a spring arranged to bias the handle toward the latched position. The spring may be made from elastomeric polymer material.

In embodiments, the handle structure may be selectively shiftable to a third kickstand position in which the handle is engaged with the support structure to prop a bottom edge of the display away from the wall. The mount may include spring arranged to bias the handle structure away from the kickstand position.

In further embodiments, an electronic display system mountable on a wall of a structure includes an electronic display and a mount. The mount includes a support structure adapted to attach to the wall and presenting a pair of vertically spaced-apart generally horizontally oriented flanges and a pair of display interface brackets. Each of the display interface brackets includes a display interface portion adapted to attach to the electronic display, and a hook bracket assembly operably coupled to the display interface bracket. The hook bracket assembly presents a hook selectively engagable over an upper one of the flanges of the support structure to hang the display interface brackets and the display from the support structure and a vertical position adjustment assembly operably coupled to the display interface bracket. The vertical position adjustment assembly enables selective vertical positioning of the display interface portion and the display relative to the support structure.

In further embodiments, a mount for attaching an electronic display to a wall includes a support structure adapted to attach to the wall. The support structure presents a pair of vertically spaced-apart generally horizontally oriented flanges. The mount further includes a pair of display interface brackets, each of the display interface brackets including a display interface portion adapted to attach to the electronic display and a hook bracket assembly operably coupled to the display interface bracket. The hook bracket assembly presents a hook selectively engagable over an upper one of the flanges of the support structure to hang the display interface brackets and the display from the support structure and a latch assembly for latching the display interface bracket to a lower one of the flanges of the support structure.

BRIEF DESCRIPTION OF THE DRAWINGS

The embodiments of the present invention may be more completely understood in consideration of the following detailed description of various embodiments in connection with the accompanying drawings, in which:

FIG. 15a is a front perspective view of a bracket assembly according to an alternative embodiment of the invention;

FIG. 15b is a rear perspective view of the bracket of FIG. 15a depicted in a partially extended kickstand position;

FIG. 15c is a side elevation view of the bracket of FIG. 15b;

FIG. 15d is a partially exploded view of the bracket of FIG. 15a;

FIG. 16a is a front elevation view of a bracket assembly according to another alternative embodiment of the invention;

FIG. 16b is a cross-sectional view taken at section 16b-16b of FIG. 16a;

FIG. 16c is a side elevation view of the bracket of FIG. 16a;

FIG. 16d is a rear perspective view of the bracket of FIG. 16a;

FIG. 16e is an exploded view of the bracket of FIG. 16d;

FIG. 16f is a view of the inset portion 16f of FIG. 16b;

Figure 1:
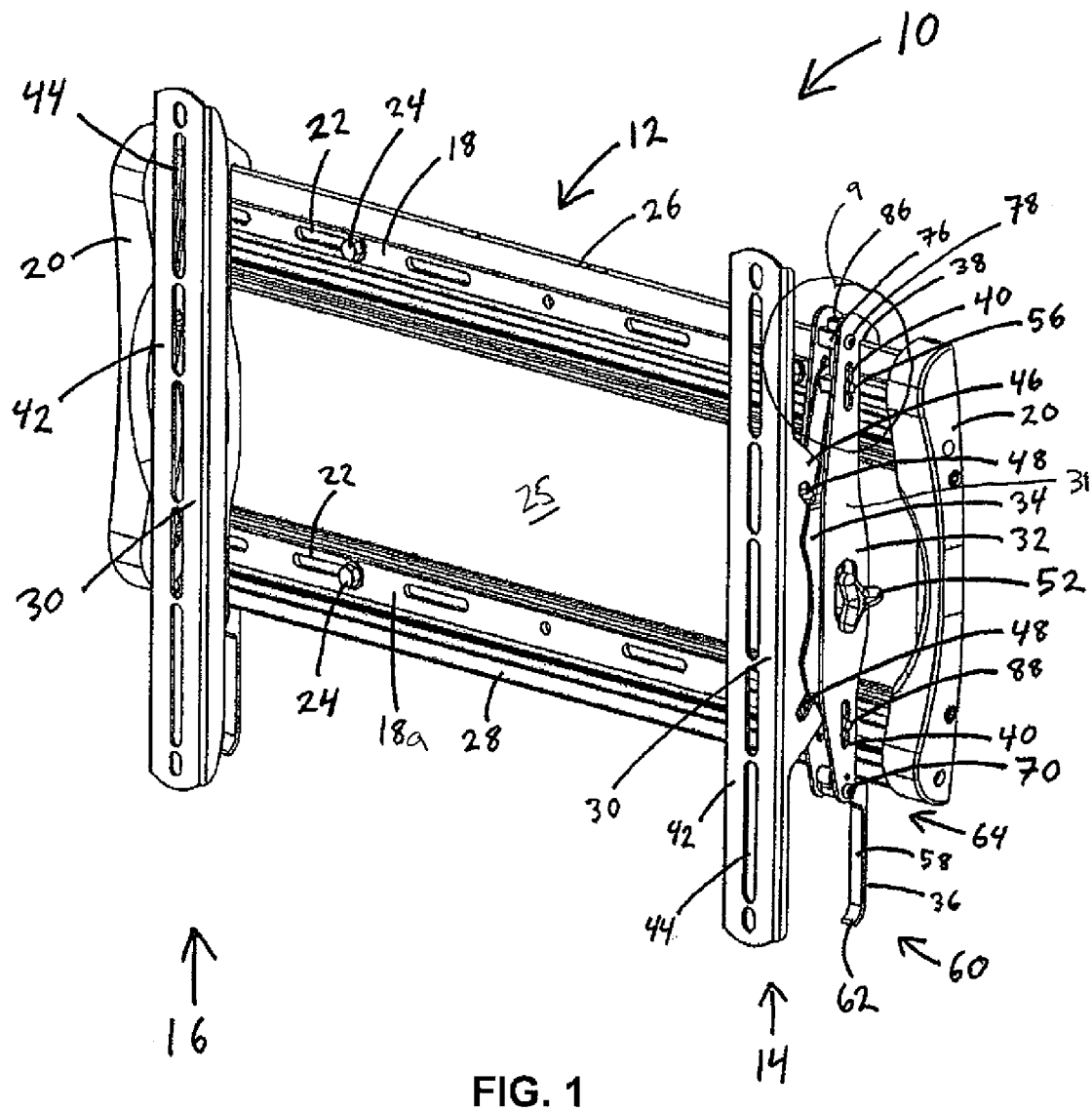
FIG. 1 is a front perspective view of a flat panel display mounting system according to an embodiment of the invention.
Figure 2:
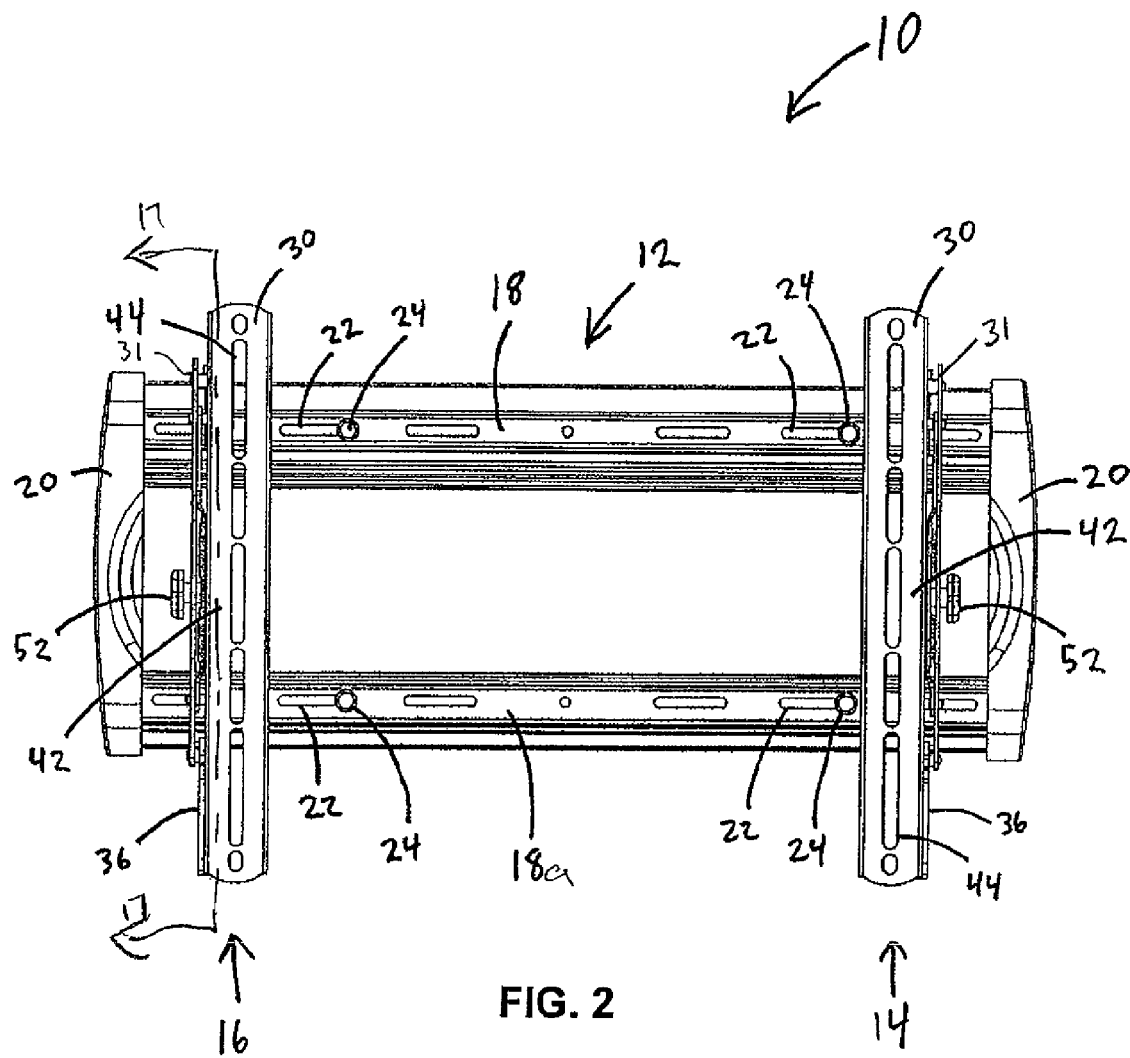
FIG. 2 is a front view of the display mounting system of FIG. 1.
Figure 3:
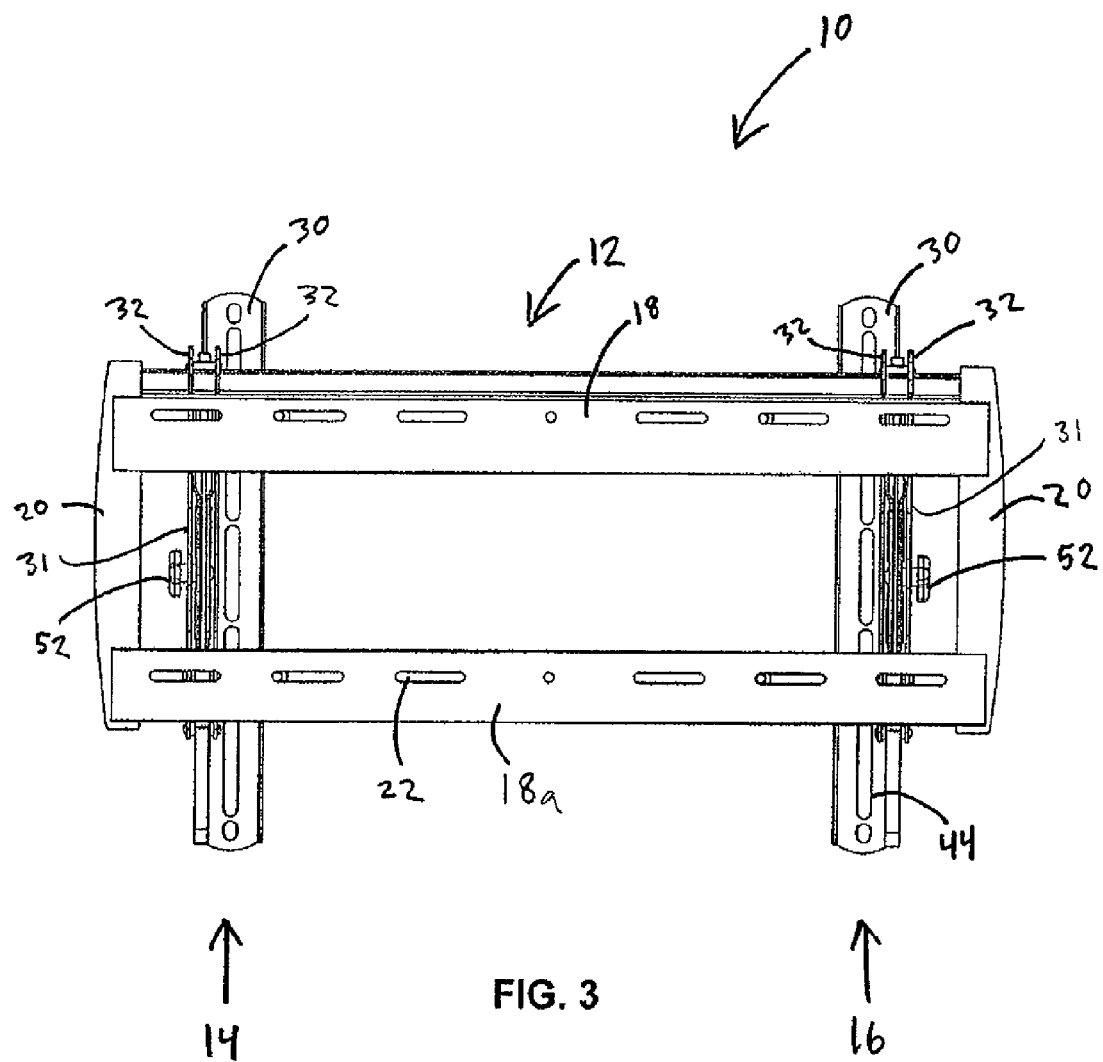
FIG. 3 is a rear view of the display mounting system of FIG. 1.
Figure 4:
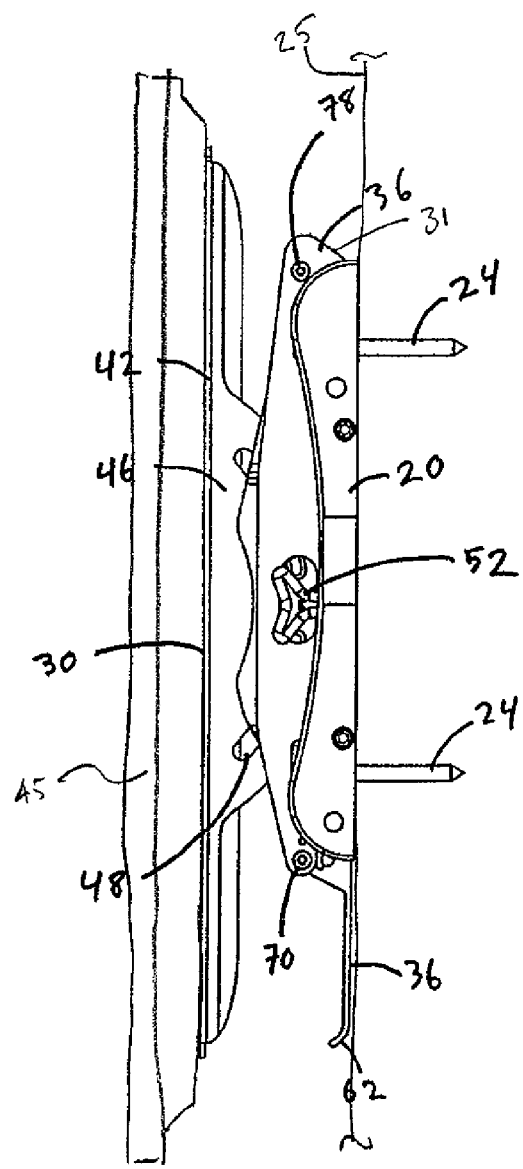
FIG. 4 is a side view of a display mounting system of FIG. 1.
Figure 5:
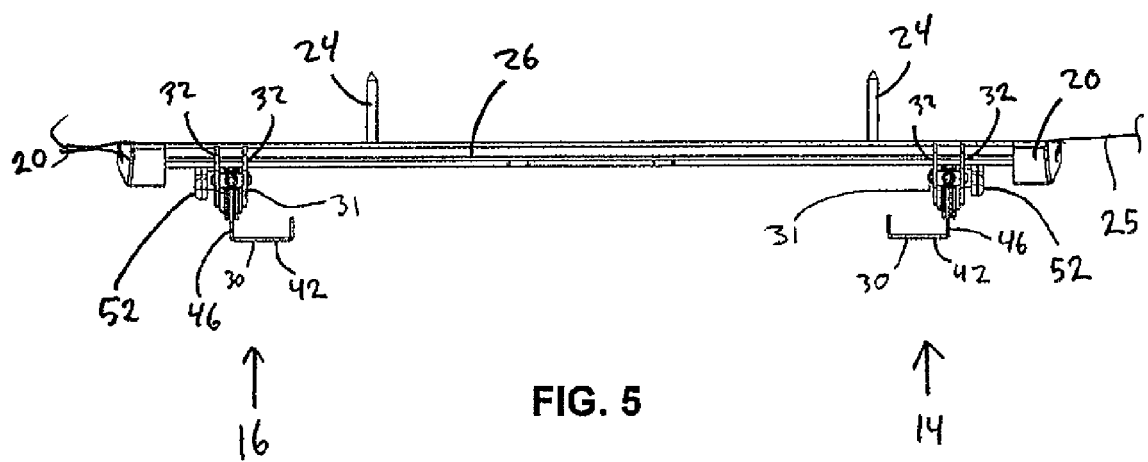
FIG. 5 is top view of a display mounting system of FIG. 1.
Figure 6:
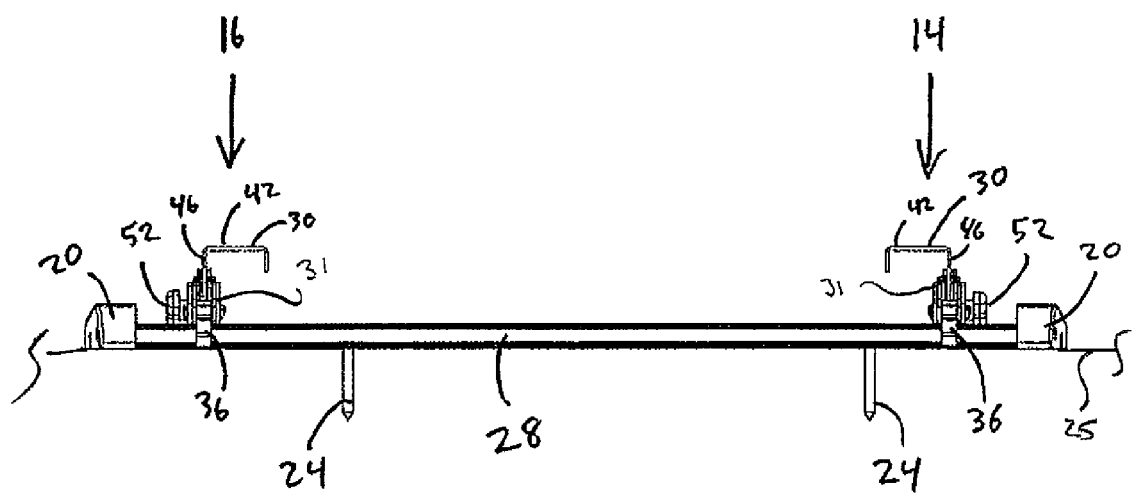
FIG. 6 is bottom view of a display mounting system of FIG. 1.

While the present invention is amendable to various modifications and alternative forms, specifics thereof have been shown by way of example in the drawings and will be described in detail. It should be understood, however, that the intention is not to limit the present invention to the particular embodiments described. On the contrary, the intention is to cover all modifications, equivalents, and alternatives falling within the spirit and scope of the present invention.

DETAILED DESCRIPTION OF THE PREFERRED EMBODIMENTS

Embodiments of the present invention relate to display mount systems for attaching a flat panel electronic display to a fixed structure. Such flat panel displays include plasma displays, liquid crystal displays (LCDs), or any other kind of electronic display that is of similar dimensions or characteristics. Fixed structures generally refer to walls, but also may include ceilings, beams, columns, pieces of furniture, booths, or any other fixed or permanent structure to which a display mount might be attached.

An embodiment of a display wall mount 10 is depicted in FIGS. 1 through 14a. Display wall mount 10 generally includes support assembly 12 and first and second display interface bracket assemblies 14, 16. Support assembly 12 generally includes two parallel, transversely disposed, spaced-apart supports 18, 18a, that are fixed together at their ends by vertical support members 20. Supports 18, 18a, define a series of openings 22 that receive fasteners 24 to mount supports 18, 18a, to a wall 25 or other fixed structure. Supports 18, 18a, define upper and lower flanges 26, 28, respectively, spanning the length of supports 18, 18a. Flanges 26, 28, are offset from the wall 25 or support structure to receive hooks and latches of bracket assemblies 14, 16, to attach bracket assemblies 14, 16, thereto.

Each bracket assembly 14, 16, generally includes display interface bracket 30, and hook bracket assembly 31. Display interface bracket 30 presents front plane 42 which defines a plurality of slots 44 for mounting to a flat panel display 45. Flange portion 46 extends rearwardly from front plane 42 along the one edge of bracket 30. Flange portion 46 defines a pair of arcuate slots 48 which define a range of tilting motion of the bracket 30.

Figure 11A:
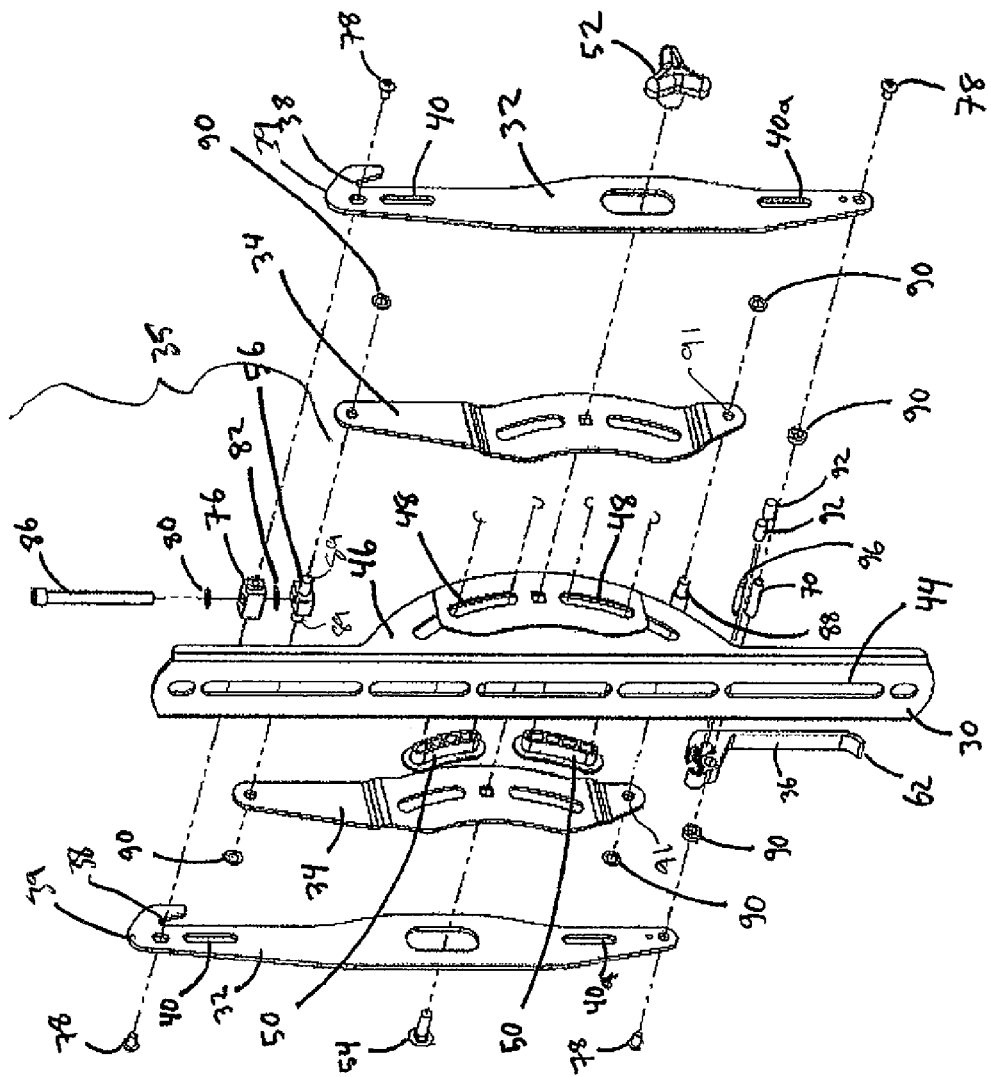
FIG. 11a is an exploded view of the right mounting bracket of the flat panel mounting system depicted in FIG. 11.

Hook bracket assembly 31, as depicted in the exploded view of FIG. 11a, generally includes parallel hook flanges 32, carrier brackets 34, vertical position adjustment assembly 35, and latch/kickstand assembly 36. Each of hook flanges 32 generally defines hook portion 38 at upper end 39 and guide slots 40, 40a. Hook flanges 32, are fastened together with fasteners 78 in a parallel spaced apart relationship with vertical position adjustment assembly 35, and latch/kickstand assembly 36 sandwiched in between.

Vertical position adjustment assembly 35 generally includes head block 76, traveling block 56, adjustment screw 86, and guide pin 88. Adjustment screw 86 is received through head block 76, but is not threadedly engaged therewith, enabling adjustment screw 86 to rotate without translating vertically. Adjustment screw 86 is threadedly engaged with traveling block 56 such that traveling block 56 translates vertically as adjustment screw 86 is rotated. Carrier brackets 34 are received between hook flanges 32 and traveling block 56 and are coupled to traveling block 56 on guide pins 89. Guide pins 89 are free to translate vertically in guide slots 40, with nylon washers 90 being provided to reduce friction. The ends of guide pin 88 extend through aperture 91 in each of carrier brackets 34. Guide pin 88 is also free to translate vertically in guide slots 40a, with nylon washers 90 being again provided to reduce friction.

Figure 9:
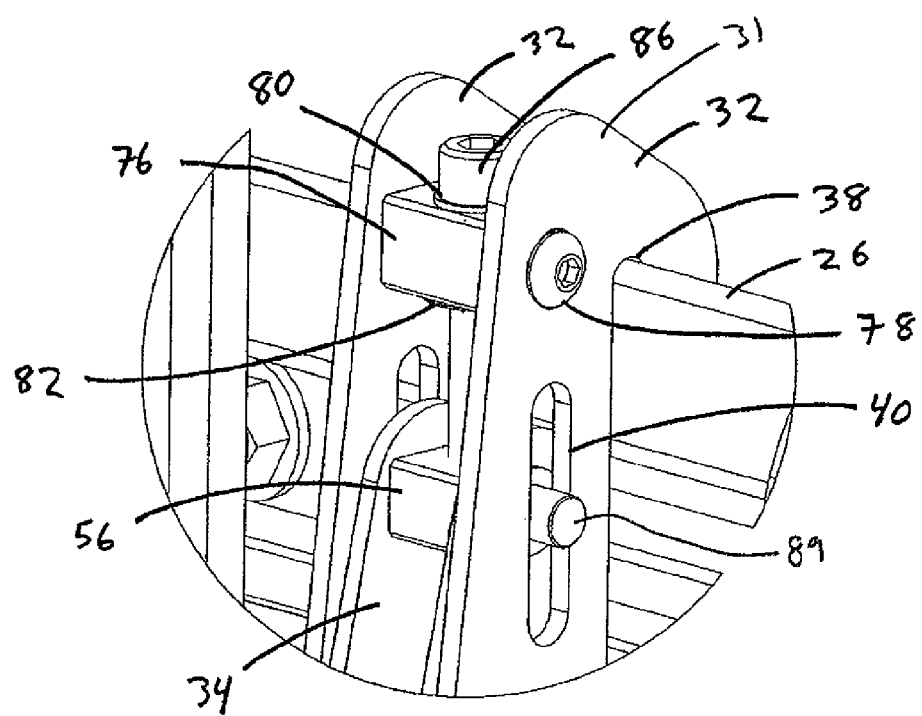
FIG. 9 is a fragmentary view of an inset portion of FIG. 1.

FIG. 9 is a detail view of the inset portion (9) of FIG. 1, depicting a portion of the vertical position adjustment assembly 35 of the display mount. While the height of the display mount will largely be determined by the mounting height of the support plates 18, this vertical position adjustment assembly 35 allows a range of height adjustment that is especially useful for precise vertical position adjustment within fractions of an inch. As there is a vertical position adjustment assembly 35 associated with each bracket assembly 14, 16, the vertical position adjustment assembly 35 may be utilized for precise leveling of display 45 as well by separately adjusting the vertical position adjustment assembly 35 of each bracket assembly 14, 16.

Each carrier bracket 34 defines guide slots 48. Glides 50 are engaged and slidable within slots 48 to enable tilting movement of bracket 30 with respect to hook bracket assembly 31. Knob 52 is provided on bolt 54 that passes through arcuate slots 48 and glides 50. Knob 52 may be tightened and loosened as desired to add or remove friction resisting tilting adjustment of bracket 30 and a display 45 attached thereto. It will be appreciated that guide slots 48 may be configured so as to define and arcuate path of travel P about a tilt axis A (depicted in FIG. 8) extending through display 45 forward of front plane 42. Display 45 may thereby be self-balancing so as to maintain any desired tilt position. One such self balancing configuration is described in U.S. Pat. No. 7,152,836, owned by the owners of the present invention, and hereby fully incorporated herein by reference.

Figure 12A:
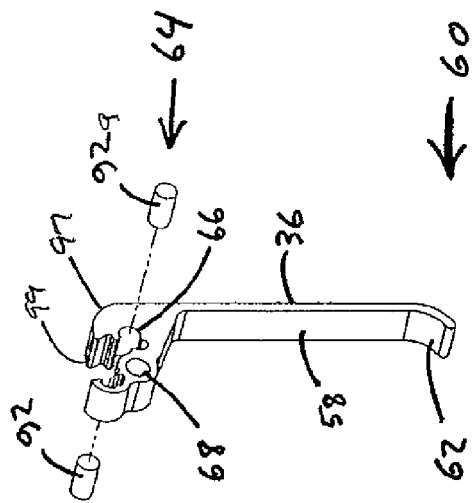
FIG. 12a is an exploded view of the assembly of FIG. 12.
Figure 12:
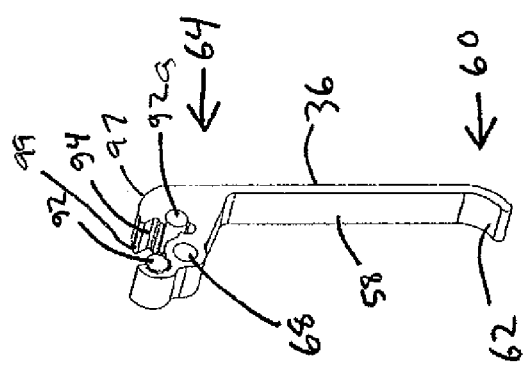
FIG. 12 is a fragmentary perspective view of a latch assembly of the mount of FIG. 1.

Latch/kickstand assembly 36 generally includes elongate portion 58 with a first free end 60 having handle portion 62 and second pivoting end 64 defining recess 66 and aperture 68. FIGS. 12 and 12a respectively depict fragmentary assembled and exploded views of the assembly 36. The shape of the interior grooves of the pivotal end 62 are shaped to receive elastomeric spring members 92, which may be made from urethane foam material. Latch pivot pin 70 extends through aperture 68 to pivotally attach assembly 36 between parallel hook flanges 32. Groove 94 is defined in second end 64 for receiving bump pin 96 extending between parallel hook flanges 32.

Latch/kickstand assembly 36, as depicted in FIGS. 1-6, functions to latch the bottom of the bracket assembly 14, 16, to the lower flange 28 of support assembly 12. This assembly 36 enables a user to quickly and efficiently secure the mount and corresponding flat panel display in the desired position by simply hooking the parallel hook flanges 32 on the upper flange 26 of the support assembly 12, adjusting the height and angle of the flat panel display, and engaging groove 94 with bottom flange 28 of support assembly 12.

Figure 7:
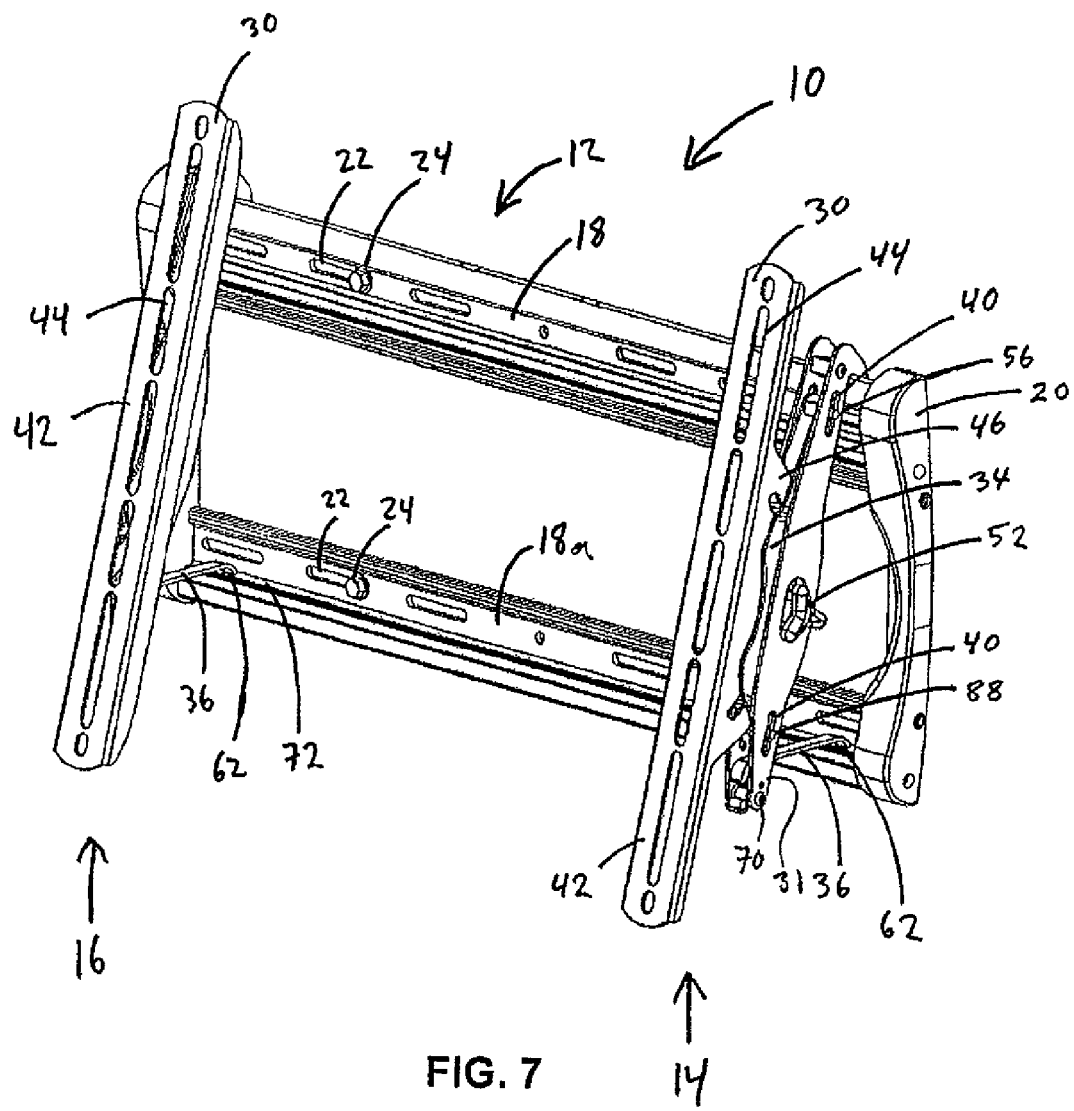
FIG. 7 is a front perspective view of the flat panel display mounting system of FIG. 1 in a kickstand configuration.
Figure 8:
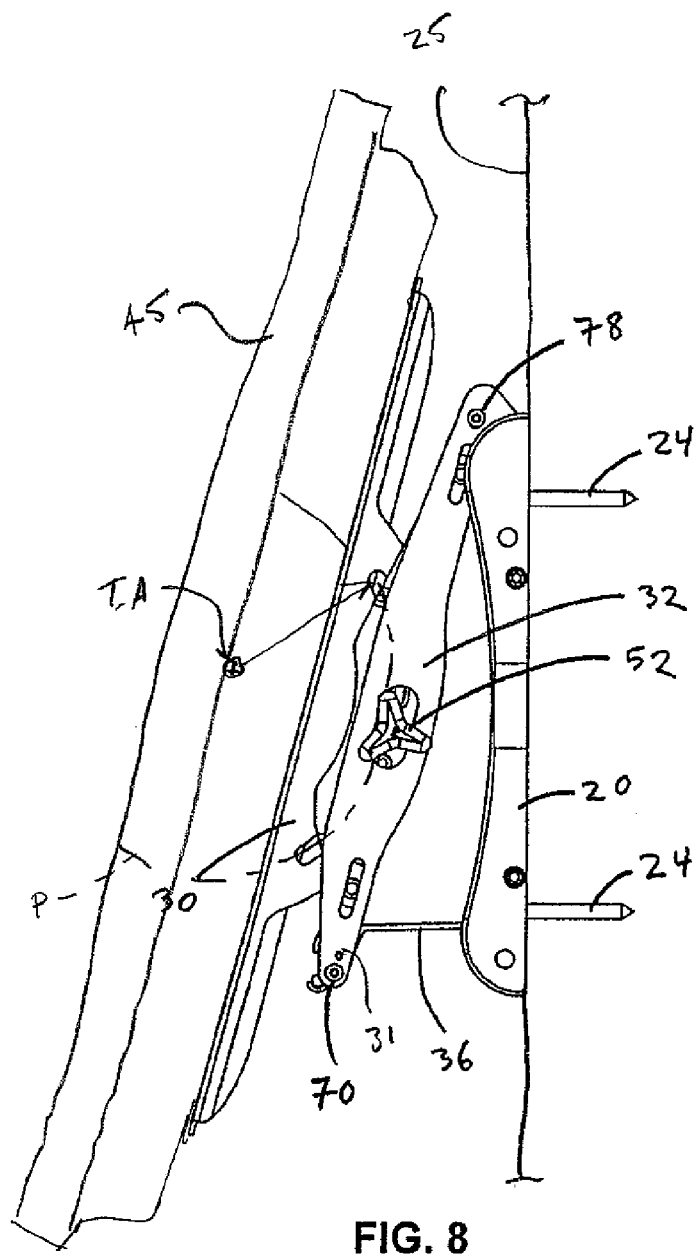
FIG. 8 is a side view of the flat panel display mounting system in the configuration of FIG. 7.

FIGS. 7 and 8 depict an additional, particularly useful configuration that may be utilized during mount installation, adjustment, maintenance, or particularly for temporary access to the back panel of a mounted flat panel display for attaching cables and wires. In this configuration, handle 62 is pivoted around latch pivot pin 70 approximately ninety degrees, such that handle 62 is engaged with groove 72 on support 18a. In this position, handle 62 functions as a kickstand to prop-up the bottom of display 45, thereby enabling easy access to the back of display 45 for connecting wires and cables. Further, this configuration is especially useful for making adjustments when a user is in the process of installing a display. Because large flat panel displays are often very heavy and awkward to hold, it can be difficult to connect wires and cables to connectors on the back of the display while the display is disengaged from the mount. This kickstand feature provides the capability of connecting wires and cables with the display already mounted, but without having the display located an excessive distance from the wall The components of latch/kickstand assembly 36 operate together to function as a spring-biased mechanism, biasing handle portion 62 to a vertically disposed position (as seen in FIGS. 1-6 for example). This vertical position biasing is maintained whether the latch is pivoted forward or rearward around the latch pivot pin 70. When handle 62 is disposed in a vertical position, spring members 92, 92a, are aligned adjacent to the bump pin 96. Rotating handle 62 rearward, as when an operator places the latch in the kickstand position, causes the bump pin to be meshed against the lower spring member 92a resulting in a biasing force against such movement. Rotating the handle 62 forward from the vertical position, as when groove 94 is to be engaged around lower flange 28 of support 18a, causes the bump pin 96 to be meshed against the upper spring member 92 resulting in a biasing force against such movement. This spring biasing arrangement is useful as this causes handle 62 in the kickstand position to immediately resume a vertical orientation when removed from the groove 72 of the support 18a.

This spring-biasing arrangement also is useful when bracket assemblies 14, 16, are pushed against lower flange 28 of support 18a to latch bracket assemblies 14, 16, in place. Rounded edge 97 rides up and over flange 28 against the bias of lower spring member 92a as bracket assembly 14, 16, is advanced inward onto flange 28. Once tip 99 is inward of flange 28, spring member 92a urges handle 62 toward the vertical position, "clicking" groove 94 into engagement with flange 28.

In use, bracket assemblies 14, 16, are attached to the rear of a flat panel display device 45 with fasteners through apertures 44, in display interface bracket 30. Hooks 38 are engaged over upper flange 26 of support assembly 12 in order to suspend the assembly of the flat panel display and bracket assemblies 14, 16, on the wall. Handle 62 may be rotated about pivot pin 70 so that handle 62 extends horizontally outward to engage groove 72 on support 18a. In this position, the bottom of the flat panel display 45 is held in the kickstand position away from the wall as depicted in FIG. 8 to enable connection of wires and cables to the back of the display. Once connection of wires, and any other desired work, is complete, the bottom of display 45 may be lifted away from the wall slightly. The bias provided by lower spring member 92a rotates handle 62 to a vertical position. As the bottom ends of bracket assemblies 14, 16, swing toward the wall, rounded edge 97 rides up and over flange 28 against the bias of lower spring member 92a as bracket assembly 14, 16, is advanced inward onto flange 28. Once tip 99 is inward of flange 28, spring member 92a urges handle 62 toward the vertical position, "clicking" groove 94 into engagement with flange 28. and thereby latching bracket assemblies 14, 16, to support 12.

The height of the display above a floor surface can be independently adjusted at each of bracket assemblies 14, 16, by rotating adjustment screw 86. As adjustment screw 86 is rotated, bracket 30 and display 45 which is attached thereto are translated up or down relative to support 12. Further, the display can be leveled laterally by adjusting either or both of the adjustment screws 86 of bracket assemblies 14, 16, independently. The display 45 may be easily dismounted by rotating handle 62 against the bias of spring member 92a until tip 99 clears flange 28, pulling horizontally outward on the bottom of the display 45, and then lifting upward on the display 45 to disengage hooks 38 from upper flange 26.

Figure 10:
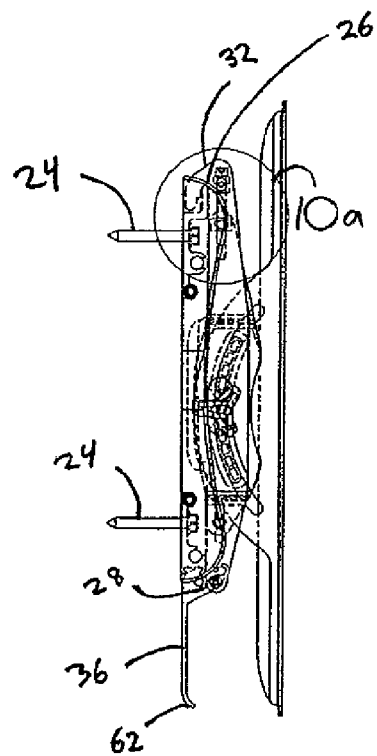
FIG. 10 is a left side phantom view of the display mounting system of FIG. 1.
Figure 10A:
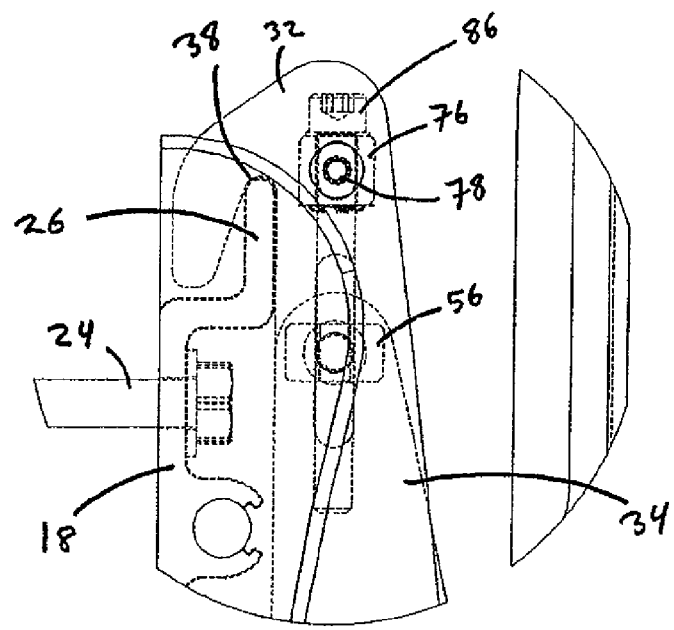
FIG. 10a is a view of the inset portion 10a of FIG. 10.

FIGS. 10 and 10a respectively set forth a phantom left side view of mount 10, and a close-up detail view of the view of FIG. 10. FIG. 10 depicts the relative engagement locations of the parallel hook flanges 32 to the upper flange portion 26 of the support plates 18, 18a, as well as the location of latch/kickstand assembly 36 in latched position relative to lower flange 28 of support 18s. Fasteners 24 are seen in the recessed portion of the support members that are directly adjacent a wall or other support structure. FIG. 10a is a more detailed view of the parallel hook flanges 32 and the vertical position adjustment components. The hooks 38 of parallel hook flanges 32 is seen to be shaped for adjacent engagement with the outside of the upper flange member 26 of support 18. Hook 38 also has an interior curvature which enables parallel hook flanges 32 to be pivoted into engagement or for angled positioning as when the kickstand configuration shown in FIGS. 7 and 8 is being used.

Figure 11:
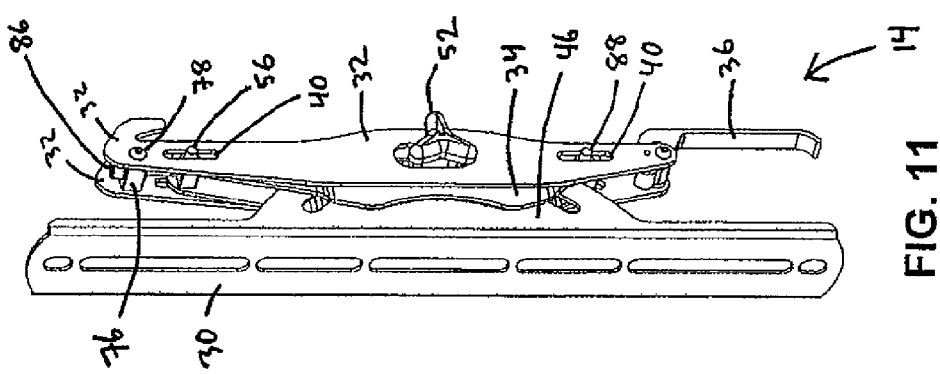
FIG. 11 is a perspective view of an assembled right mounting bracket of the flat panel mounting system.
Figure 13A:
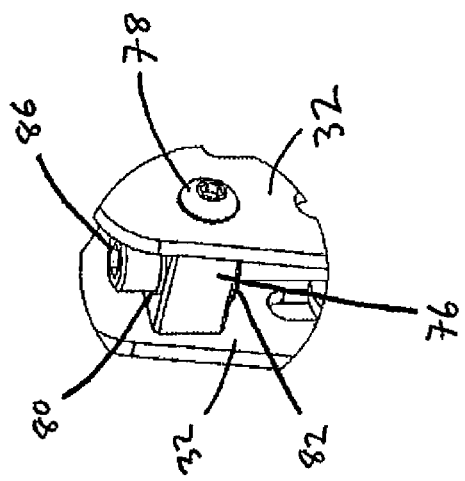
FIG. 13a is a view of the inset portion 13a of FIG. 13.
Figure 13:
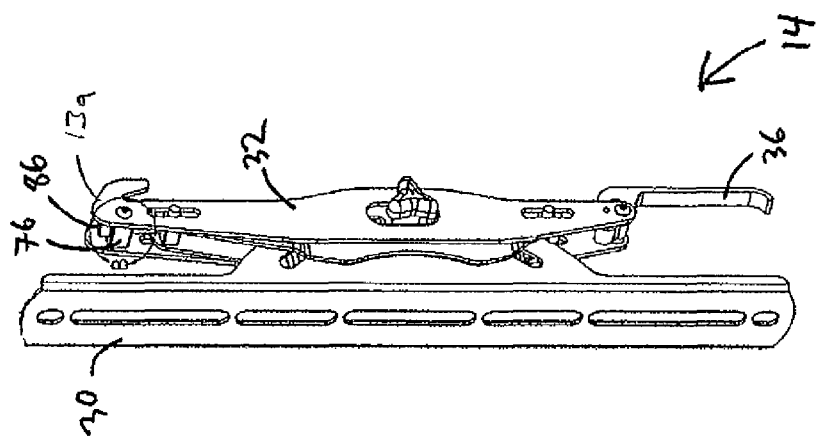
FIG. 13 is a perspective view of a bracket assembly of the mount of FIG. 1.
Figure 14A:
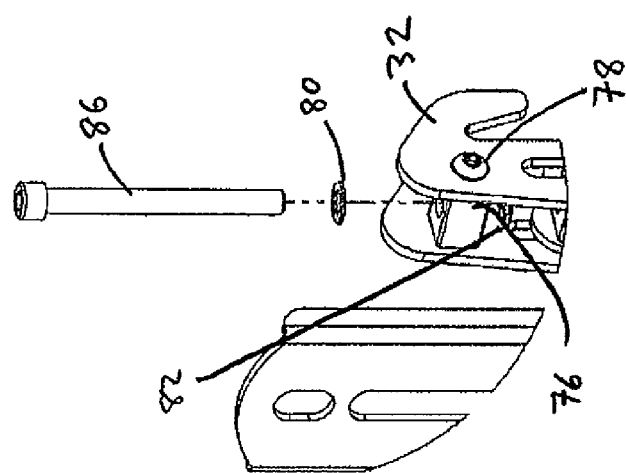
FIG. 14a is a view of the inset portion 14a of FIG. 14.
Figure 14:
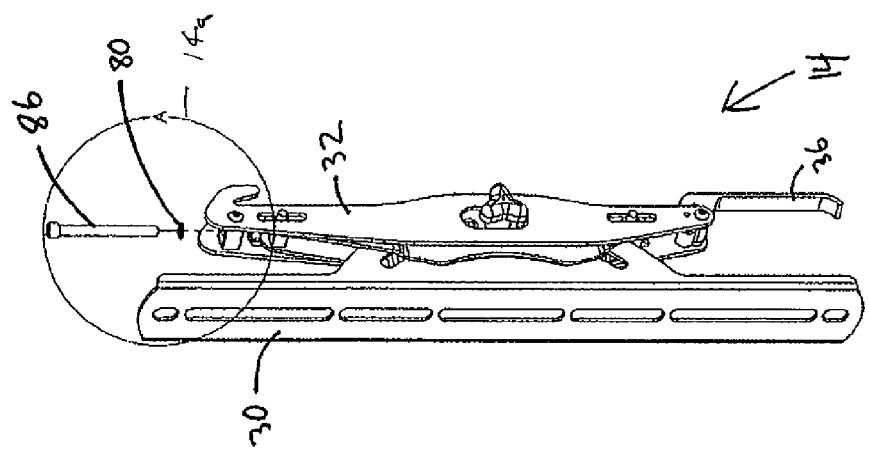
FIG. 14 is an exploded perspective view of a bracket assembly of the mount of FIG. 1.
Figures 15A, 15B, 15C, 15D:
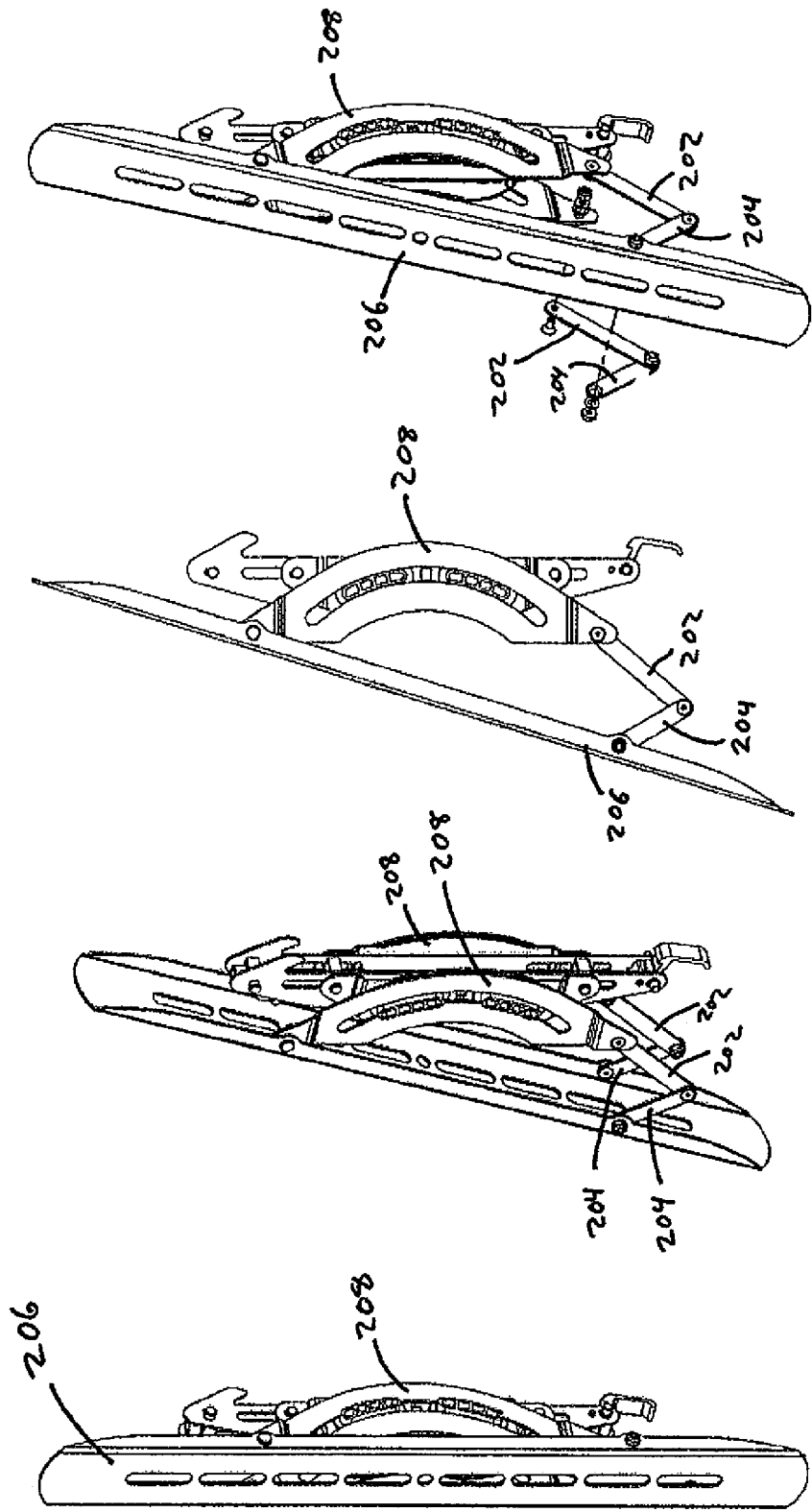
Figure 17:
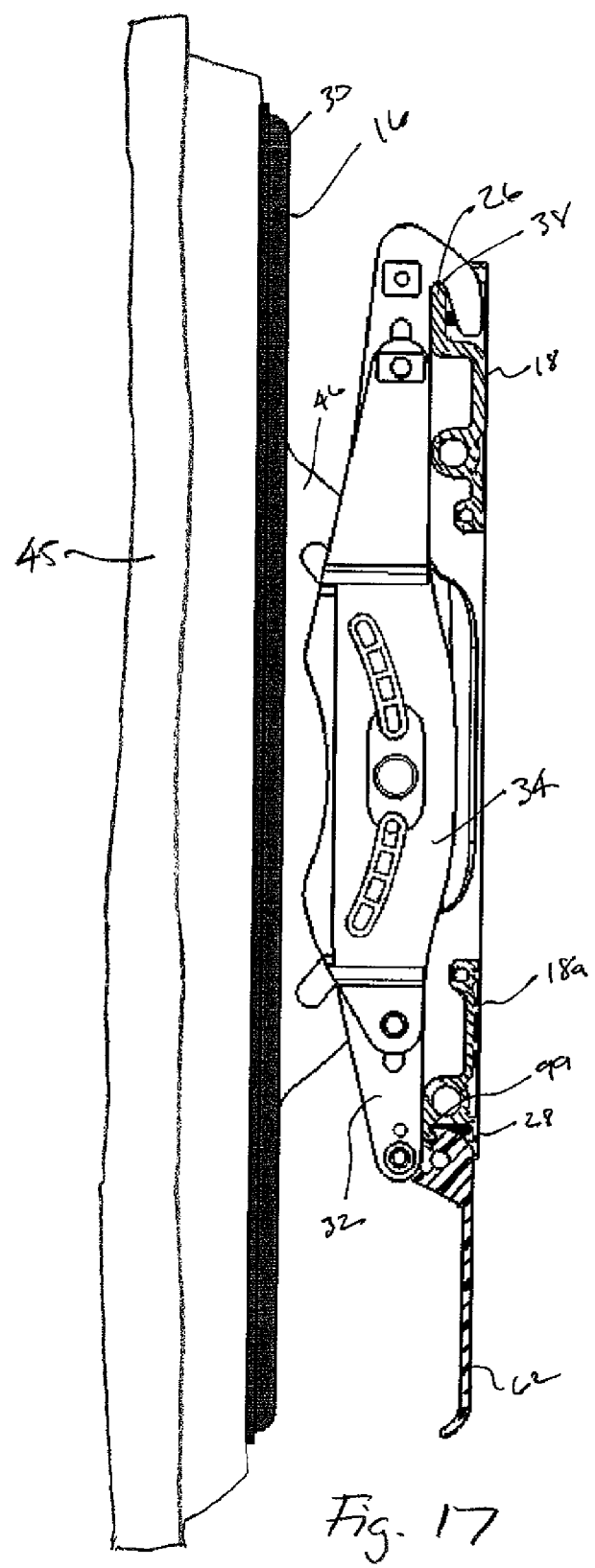
FIG. 17 is a cross-sectional view taken at section 17-17 of FIG. 2.

The assembled view of the bracket assembly depicted in FIG. 11 and the exploded view of the right bracket assembly in FIG. 11a provide a comprehensive layout of the bracket assemblies 14, 16, in this embodiment. FIG. 13a depicts a detail view of the inset portion 13a of FIG. 13. FIG. 14a shows a detail view of the inset portion of FIG. 14. The components are depicted in a partially exploded configuration for clarity.

FIGS. 15a-d disclose an alternate embodiment of the bracket assembly of the flat panel display mount where two sets of hinged arms 202 and 204 are utilized in place of the kickstand arrangement of the previously disclosed embodiment. The hinged arms 202 and 204 generally form a linkage between an outer bracket member 206 and a pair of side bracket members 208. These hinged arms are pivotally mounted using fasteners and washers at their pivoting ends. These hinged arms allow the bracket assembly to tilt away from the wall or mounting structure to access the back side of a mounted flat panel display and to aid in connecting wires and cables.

FIGS. 16a-f disclose an alternative embodiment of the bracket assembly of the flat panel display mount where an alternative latching arrangement is disclosed. This arrangement uses a latch 210 which is spring-biased in a single direction. This biasing occurs when the latch 210 is rotated around a latch pivot pin 212 to ride over a ridge on support plate 214 for clipping the latch in place. A urethane dowel 216 functions as a biased spring when compressed against a mounted pin 218. Using this arrangement, the latch 210 is able to open automatically when the bracket 206 is swung down against the wall during mounting and to click into a latched state.

Figure 18:
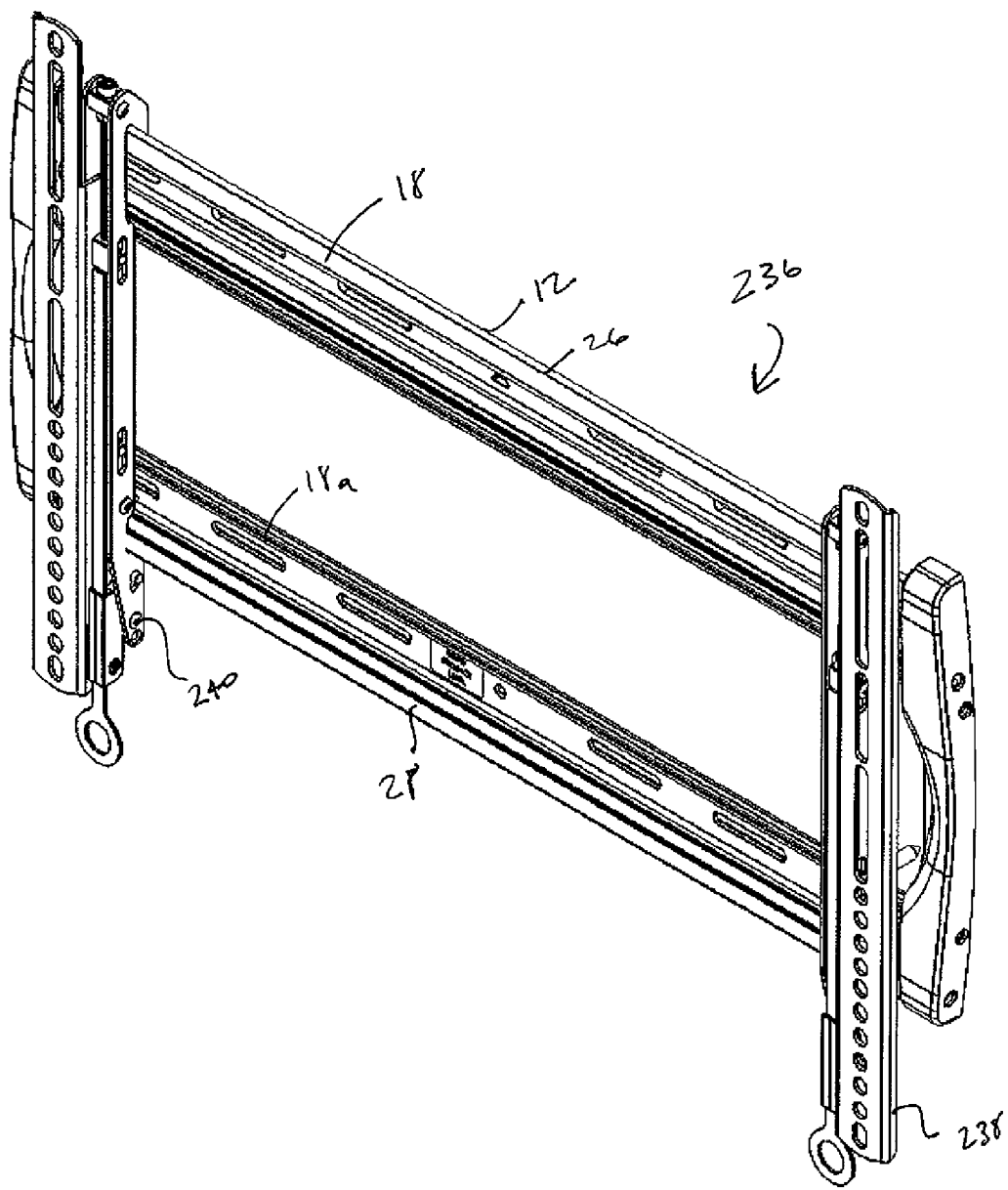
FIG. 18 is a front perspective view of a mount according to an alternative embodiment of the invention.
Figure 19:
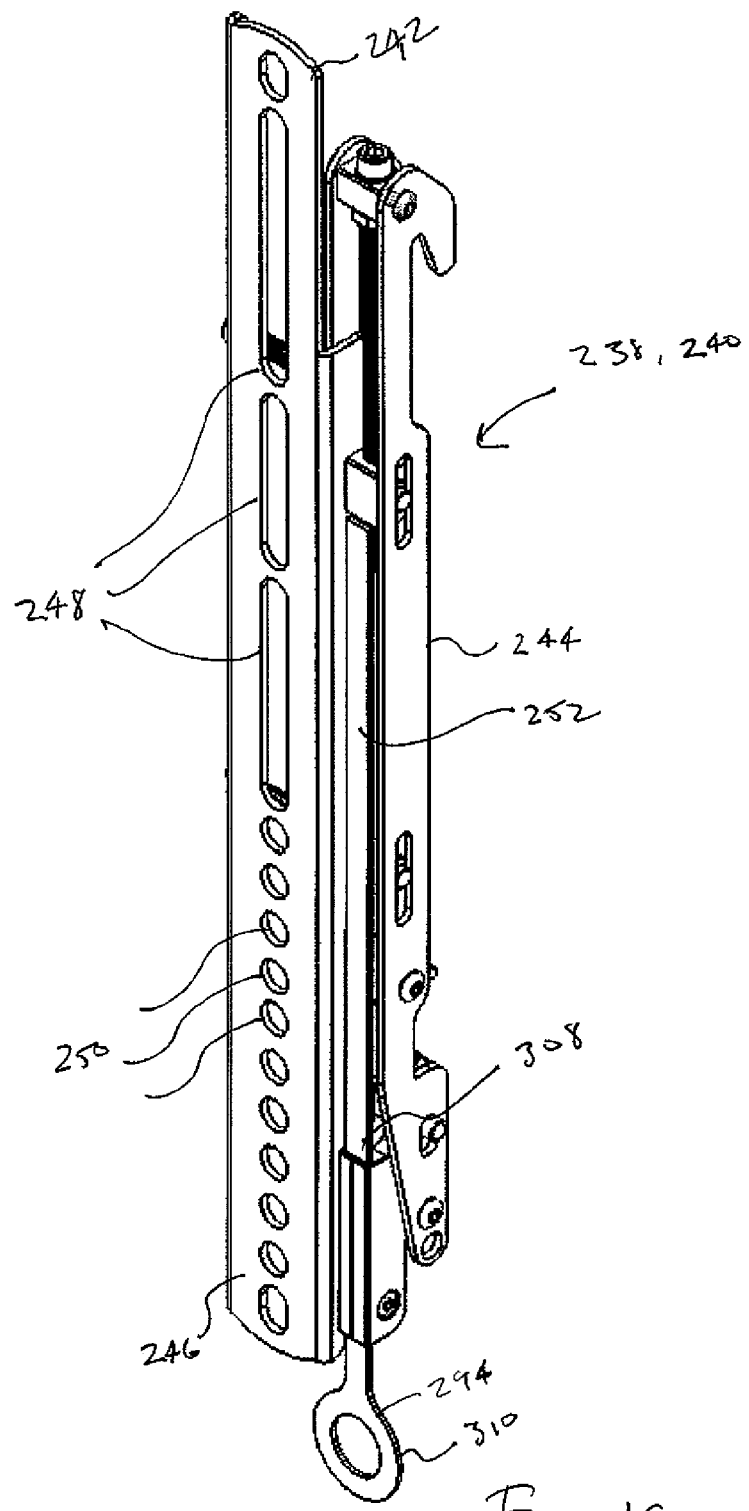
FIG. 19 is a front perspective view of a display interface bracket of the mount of FIG. 18.
Figure 20:
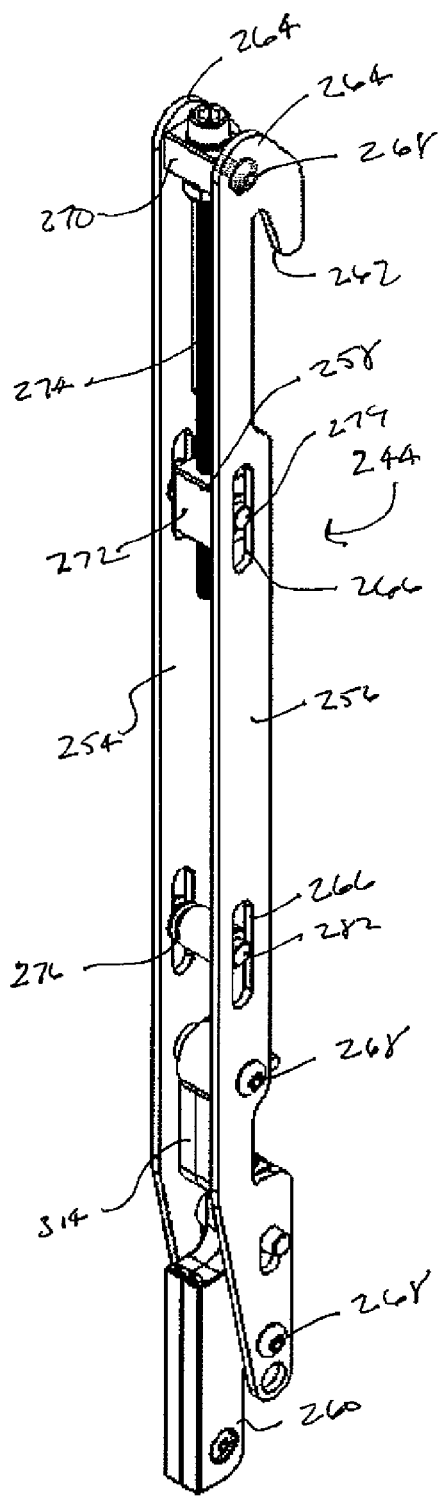
FIG. 20 is a cutaway view of the display interface bracket of FIG. 19.
Figure 21:
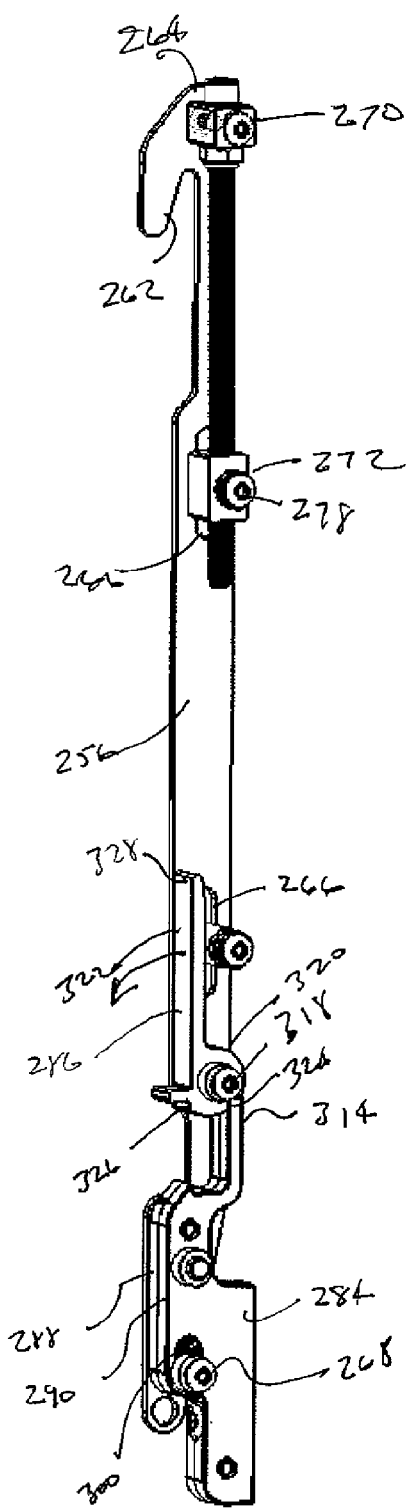
FIG. 21 is a further cutaway view of the opposite side of the display interface bracket of FIG. 19.
Figure 22:
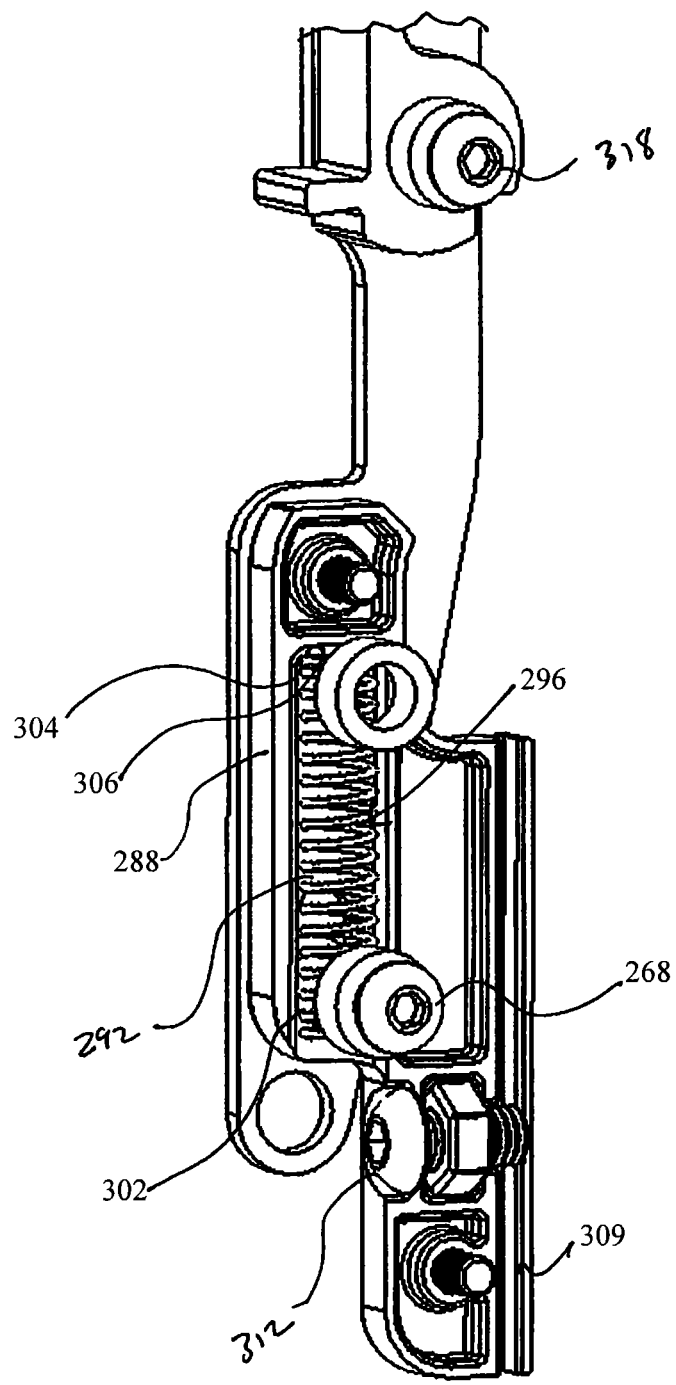
FIG. 22 is a fragmentary cutaway view of the spring latch portion of the display interface bracket of FIG. 19.
Figure 23:
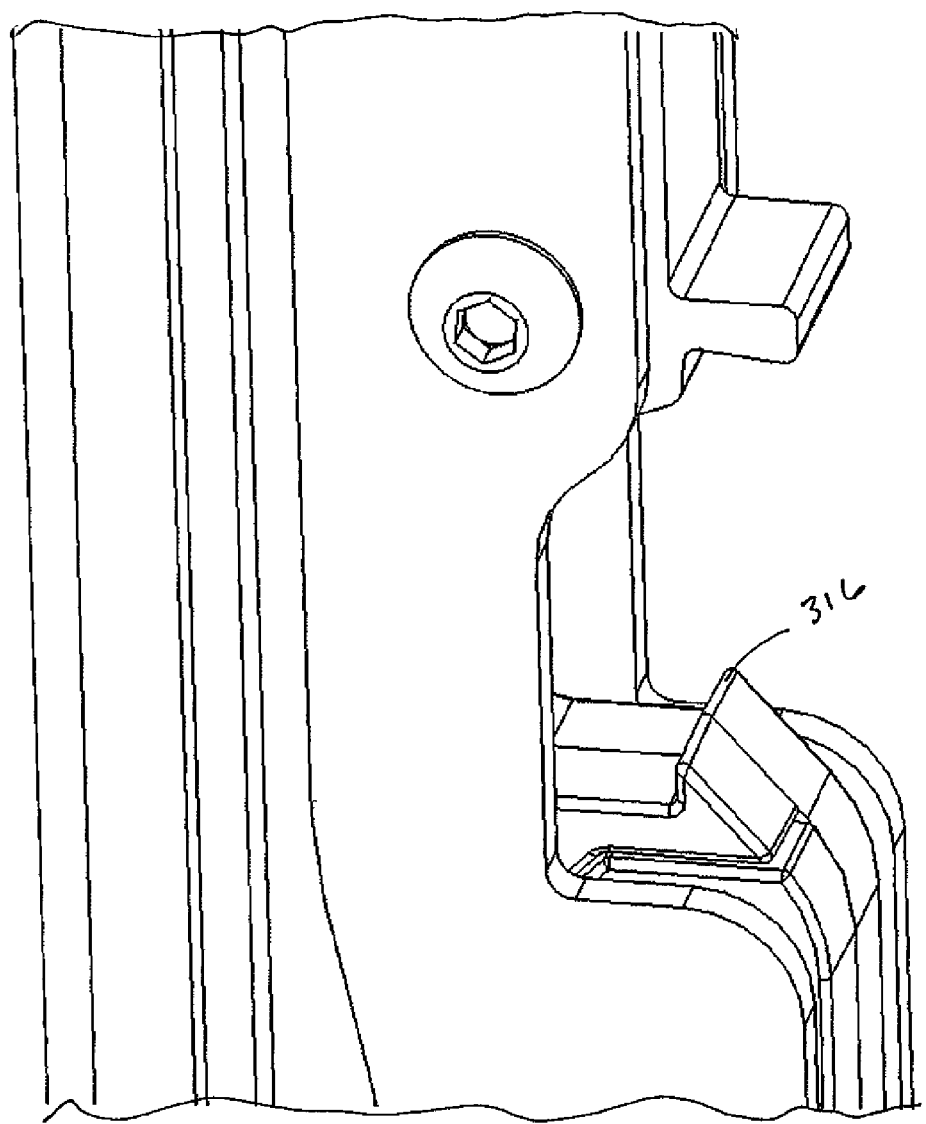
FIG. 23 is a fragmentary perspective view of a top edge of the spring latch portion of the display interface bracket of FIG. 19.

In FIGS. 18-23 there is depicted a further embodiment enabling a display to be mounted very close to a wall surface. As depicted in FIG. 18, mount 236 generally includes support assembly 12 and display interface brackets 238, 240. Support assembly 12 being previously described, each of display interface brackets 238, 240, as depicted in FIGS. 19-23, generally includes display interface flange 242 and hook bracket assembly 244. Display interface flange 242 has front plane 246 defining a plurality of elongate apertures 248 and round apertures 250 for receiving fasteners (not depicted) to attach display interface bracket 238, 240, to the back of a flat panel display device 45. Additionally, display interface flange 242 has attachment flange 252 extending rearwardly for attaching display interface flange 242 to hook bracket assembly 244.

Hook bracket assembly 244, depicted in FIGS. 20-23 with portions cut away for clarity, generally includes parallel hook flanges 254, 256, vertical position adjustment assembly 258, and latch/kickstand assembly 260. Each of hook flanges 254, 256, generally defines hook 262 at upper end 264 and guide slots 266. Hook flanges 254, 256, are fastened together with fasteners 268 in a parallel spaced apart relationship with vertical position adjustment assembly 258, and latch/kickstand assembly 260 sandwiched in between.

Vertical position adjustment assembly 258 generally includes head block 270, traveling block 272, adjustment screw 274, and guide pin 276. Adjustment screw 274 is received through head block 270, but is not threadedly engaged therewith, enabling adjustment screw 274 to rotate without translating vertically. Adjustment screw is threadedly engaged with traveling block 272 such that traveling block 272 translates vertically as adjustment screw 274 is rotated. Attachment flange 252 is received between hook flange 254 and traveling block 272 and is fixed to traveling block 272 with fastener 278. Fastener 278 and projection 279 are free to translate vertically in guide slots 266. Fastener 280 couples attachment flange 252 with guide pin 276. Fastener 280 and guide pin end 282 are also free to translate vertically in guide slots 266.

Latch/kickstand assembly 260 generally includes spring latch 284 and kickstand 286. Spring latch 284 is vertically slidably disposed between hook flanges 254, 256, and generally includes housing halves 288, 290, spring 292, and pull handle 294. Housing halves 288, 290, define internal cavity 296 which receives spring 292 therein. Fastener 268 extends through apertures in hook flanges 254, 256, elongate slot 300 defined in housing halves 288, 290. Bottom end 302 of spring 292 bears on fastener 268, while top end 304 of spring 292 bears on inner wall 306, such that spring latch 284 is biased in an upward direction by spring 292. Strap portion 308 is received and trapped in slot 309 defined by housing halves 288, 290. The distance that pull ring portion 310 extends below spring latch 284 can be adjusted by loosening fastener 312, and pulling or pushing strap portion 308 so that pull ring 310 is a desired distance below spring latch 284, and retightening fastener 312. In this way, the position of pull ring 310 can be adjusted so as to be immediately adjacent the bottom edge of a display attached to mount 236.

Housing half 290 has upwardly projecting tab 314 and also defines upwardly projecting lip 316. Kickstand 286 is pivotally mounted between hook flanges 254, 256, at pivot 318, and generally includes hub 320 and arm 322. Hub 320 defines first shoulder 324 and second shoulder 326. Kickstand 286 is held in a retracted position as depicted in the figures by the engagement of tab 314 with shoulder 324, preventing rotation of kickstand 286.

In use, display interface brackets 238, 240, are attached to the rear of a flat panel display device with fasteners through apertures 248, 250, in display interface flange 242. Hooks 262 are engaged over upper flange 26 of support assembly 12 in order to suspend the assembly of the flat panel display and display interface brackets 238, 240, on the wall. Spring latch 284 may then be pulled downward against the bias of spring 292. As tab 314 is drawn downward and disengaged from first shoulder 324, kickstand 286 rotates around pivot 318 by gravity (in the direction of the arrow depicted in FIG. 21) so that arm 322 extends horizontally outward. In this position, spring latch 284 may be released so that tab 314 contacts second shoulder 326 to hold kickstand 286 in position and prevent further rotation. End 328 of arm 322 contacts the lower support 18 in this position, thereby holding the bottom of the flat panel display attached to mount 236 away from the wall to enable connection of wires and cables to the back of the display. Once connection of wires, and any other desired work, is complete, kickstand 286 may be rotated in the reverse direction, disengaging tab 314 from second shoulder 326. As the bottom ends of display interface brackets 238, 240, swing toward the wall, upwardly projecting lip 316 rides over flange 28, forcing spring latch 284 downward against the bias of spring 292. Once lip 316 is on the rear side of flange 28, spring latch 284 is urged upward by the bias of spring 292, thereby latching display interface brackets 238, 240, to support 12.

The height of the display above a floor surface can be independently adjusted at each of display interface brackets 238, 240, by rotating adjustment screw 274. As adjustment screw 274 is rotated, display interface flange 242 and the display attached thereto are translated up or down relative to hook brackets assembly 244 and support 12. Further, the display can be leveled laterally by adjusting either or both of the adjustment screws of display interface brackets 238, 240 independently. The display may be easily dismounted by pulling spring latches 284 downward so that lips 316 clear flange 28, pulling horizontally outward on the bottom of the display, and then lifting upward on the display to disengage hooks 262 from upper flange 26.

The embodiments above are intended to be illustrative and not limiting. Additional embodiments are encompassed within the scope of the claims. Although the present invention has been described with reference to particular embodiments, those skilled in the art will recognize that changes may be made in form and detail without departing from the spirit and scope of the invention. For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A mount for attaching an electronic display to a wall, the mount comprising:
  a support structure adapted to attach to the wall, the support structure presenting a pair of vertically spaced-apart generally horizontally oriented flanges;
  a pair of display interface brackets, each of the display interface brackets comprising:
    a display interface portion adapted to attach to the electronic display; and
    a hook bracket assembly operably coupled to the display interface bracket, the hook bracket assembly presenting a hook selectively engagable over an upper one of the flanges of the support structure to hang the display interface brackets and the display from the support structure, the hook bracket assembly further including a vertical position adjustment assembly operably coupled to the display interface bracket, the vertical position adjustment assembly enabling selective vertical positioning of the display interface portion and the display relative to the support structure,
  wherein the vertical position adjustment assembly comprises an adjustment screw and a traveling block, the traveling block operably coupled to the display interface bracket.

2. The mount of claim 1, wherein the hook bracket assembly includes a latch assembly for latching the display interface bracket to a lower one of the flanges of the support structure.

3. The mount of claim 2, wherein the latch assembly comprises a vertically slidable housing selectively shiftable between a first latched position in which a tab portion of the housing is engaged behind the lower one of the flanges of the support structure, and a second unlatched position in which the tab portion is clear of the lower one of the flanges to enable the display interface bracket to be disengaged from the support structure.

4. The mount of claim 3, further comprising a spring biasing the housing toward the latched position.

5. The mount of claim 3, further comprising a kickstand selectively shiftable between a first position in which an end of the kickstand is engaged with the support structure to prop a bottom edge of the display away from the wall, and a second position in which the kickstand is clear of the support structure to enable the latch assembly to be engaged with the support structure.

6. The mount of claim 2, wherein the latch assembly comprises a handle structure pivotally coupled to the hook bracket assembly, the handle structure defining a groove for engaging the lower one of the flanges of the support structure.

7. The mount of claim 6, wherein the handle structure is selectively shiftable between a first latched position in which the groove is engaged with the lower one of the flanges of the support structure to latch the display interface bracket to the support structure, and a second unlatched position in which the groove is clear of the lower one of the flanges of the support structure to enable the display interface bracket to be disengaged from the support structure.

8. The mount of claim 7, further comprising a spring arranged to bias the handle toward the latched position.

9. The mount of claim 8, wherein the spring is comprised of elastomeric polymer material.

10. The mount of claim 7, wherein the handle structure is selectively shiftable to a third kickstand position in which the handle is engaged with the support structure to prop a bottom edge of the display away from the wall.

11. The mount of claim 10, further comprising a spring arranged to bias the handle structure away from the kickstand position.

12. An electronic display system mountable on a wall of a structure, the system comprising:
  an electronic display; and
  a mount comprising:
    a support structure adapted to attach to the wall, the support structure presenting a pair of vertically spaced-apart generally horizontally oriented flanges;
    a pair of display interface brackets, each of the display interface brackets comprising:
      a display interface portion adapted to attach to the electronic display; and
      a hook bracket assembly operably coupled to the display interface bracket, the hook bracket assembly presenting a hook selectively engagable over an upper one of the flanges of the support structure to hang the display interface brackets and the display from the support structure, the hook bracket assembly further including a vertical position adjustment assembly operably coupled to the display interface bracket, the vertical position adjustment assembly enabling selective vertical positioning of the display interface portion and the display relative to the support structure, wherein the vertical position adjustment assembly comprises an adjustment screw and a traveling block, the traveling block operably coupled to the display interface bracket.

13. The system of claim 12, wherein the hook bracket assembly includes a latch assembly for latching the display interface bracket to a lower one of the flanges of the support structure.

14. The system of claim 13, wherein the latch assembly comprises a vertically slidable housing selectively shiftable between a first latched position in which a tab portion of the housing is engaged behind the lower one of the flanges of the support structure, and a second unlatched position in which the tab portion is clear of the lower one of the flanges to enable the display interface bracket to be disengaged from the support structure.

15. The system of claim 14, further comprising a spring biasing the housing toward the latched position.

16. The system of claim 14, further comprising a kickstand selectively shiftable between a first position in which an end of the kickstand is engaged with the support structure to prop a bottom edge of the display away from the wall, and a second position in which the kickstand is clear of the support structure to enable the latch assembly to be engaged with the support structure.

17. The system of claim 13, wherein the latch assembly comprises a handle structure pivotally coupled to the hook bracket assembly, the handle structure defining a groove for engaging the lower one of the flanges of the support structure.

18. The system of claim 17, wherein the handle structure is selectively shiftable between a first latched position in which the groove is engaged with the lower one of the flanges of the support structure to latch the display interface bracket to the support structure, and a second unlatched position in which the groove is clear of the lower one of the flanges of the support structure to enable the display interface bracket to be disengaged from the support structure.

19. The system of claim 18, further comprising a spring arranged to bias the handle toward the latched position.

20. The system of claim 19, wherein the spring is comprised of elastomeric polymer material.

21. The system of claim 17, wherein the handle structure is selectively shiftable to a third kickstand position in which the handle is engaged with the support structure to prop a bottom edge of the display away from the wall.

22. The system of claim 21, further comprising a spring arranged to bias the handle structure away from the kickstand position.

23. A mount for attaching an electronic display to a wall, the mount comprising:
a support structure adapted to attach to the wall, the support structure presenting a pair of vertically spaced-apart generally horizontally oriented flanges;
a pair of display interface brackets, each of the display interface brackets comprising:
a display interface portion adapted to attach to the electronic display; and
a hook bracket assembly operably coupled to the display interface bracket, the hook bracket assembly presenting a hook selectively engagable over an upper one of the flanges of the support structure to hang the display interface brackets and the display from the support structure, the hook bracket assembly further including a latch assembly for latching the display interface bracket to a lower one of the flanges of the support structure, wherein the latch assembly comprises a vertically slidable housing selectively shiftable between a first latched position in which a tab portion of the housing is engaged behind the lower one of the flanges of the support structure, and a second unlatched position in which the tab portion is clear of the lower one of the flanges to enable the display interface bracket to be disengaged from the support structure.

24. The mount of claim 23 further comprising a spring biasing the housing toward the latched position.

25. The mount of claim 24, further comprising a kickstand selectively shiftable between a first position in which an end of the kickstand is engaged with the support structure to prop a bottom edge of the display away from the wall, and a second position in which the kickstand is clear of the support structure to enable the latch assembly to be engaged with the support structure.

26. The mount of claim 23, further including a vertical position adjustment assembly operably coupled to the display interface bracket, the vertical position adjustment assembly enabling selective vertical positioning of the display interface portion and the display relative to the support structure.

27. A mount for attaching an electronic display to a wall, the mount comprising:
a support structure adapted to attach to the wall, the support structure presenting a pair of vertically spaced-apart generally horizontally oriented flanges;
a pair of display interface brackets, each of the display interface brackets comprising:
a display interface portion adapted to attach to the electronic display; and
a hook bracket assembly operably coupled to the display interface bracket, the hook bracket assembly presenting a hook selectively engagable over an upper one of the flanges of the support structure to hang the display interface brackets and the display from the support structure, the hook bracket assembly further including a latch assembly for latching the display interface bracket to a lower one of the flanges of the support structure, wherein the latch assembly comprises a handle structure pivotally coupled to the hook bracket assembly, the handle structure defining a groove for engaging the lower one of the flanges of the support structure.

28. The mount of claim 27, wherein the handle structure is selectively shiftable between a first latched position in which the groove is engaged with the lower one of the flanges of the support structure to latch the display interface bracket to the support structure, and a second unlatched position in which the groove is clear of the lower one of the flanges of the support structure to enable the display interface bracket to be disengaged from the support structure.

29. The mount of claim 28, further comprising a spring arranged to bias the handle toward the latched position.

30. The mount of claim 27, wherein the handle structure is selectively shiftable to a third kickstand position in which the handle is engaged with the support structure to prop a bottom edge of the display away from the wall.

31. The mount of claim 30, further comprising a spring arranged to bias the handle structure away from the kickstand position.

* * * * *